United States Patent
Grober et al.

(10) Patent No.: US 6,376,149 B2
(45) Date of Patent: Apr. 23, 2002

(54) METHODS AND COMPOSITIONS FOR IMAGING ACIDS IN CHEMICALLY AMPLIFIED PHOTORESISTS USING PH-DEPENDENT FLUOROPHORES

(75) Inventors: Robert David Grober, Milford, CT (US); Scott Josef Bukofsky, Hopewell Junction, NY (US); Paul Michael Dentinger, Castro Valley, CA (US); James Welch Taylor, Cross Plains, WI (US)

(73) Assignees: Yale University, New Haven, CT (US); Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 09/320,101

(22) Filed: May 26, 1999

(51) Int. Cl.$^7$ .............................. G03C 5/16; G03C 1/73
(52) U.S. Cl. ................. 430/139; 430/281.1; 430/270.1; 250/458.1
(58) Field of Search .............................. 430/139, 270.1, 430/374, 281.1, 286.1; 422/58; 549/394, 227; 250/458.1

(56) References Cited

U.S. PATENT DOCUMENTS

| | | | |
|---|---|---|---|
| 4,692,690 A | 9/1987 | Hara et al. ............... 324/73 PC |
| 4,803,049 A | 2/1989 | Hirschfeld et al. ............ 422/58 |
| 4,816,686 A | 3/1989 | Hara et al. ................ 250/458.1 |
| 4,884,890 A | 12/1989 | Coates ........................ 356/384 |
| 5,043,265 A | * 8/1991 | Tanke et al. .................... 435/6 |
| 5,208,651 A | 5/1993 | Buican ........................ 356/346 |
| 5,227,487 A | 7/1993 | Haugland et al. ............. 546/15 |
| 5,302,731 A | 4/1994 | Pitrer et al. .................. 549/394 |
| 5,340,700 A | 8/1994 | Chen et al. .................. 430/312 |
| 5,362,585 A | 11/1994 | Adams ......................... 430/30 |
| 5,362,600 A | 11/1994 | Sinta et al. .................. 430/192 |
| 5,387,527 A | 2/1995 | Sternberg .................... 436/518 |
| 5,391,465 A | 2/1995 | Feely .......................... 430/325 |
| 5,393,642 A | 2/1995 | DuBois et al. ............... 430/271 |
| 5,403,695 A | 4/1995 | Hayase et al. ............... 430/192 |
| 5,457,003 A | * 10/1995 | Tanaka et al. ............... 430/176 |
| 5,473,396 A | 12/1995 | Okajima et al. ............ 353/122 |
| 5,492,793 A | 2/1996 | Breyta et al. .......... 430/270.14 |
| 5,504,336 A | 4/1996 | Noguchi ................... 250/458.1 |
| 5,625,020 A | 4/1997 | Breyta et al. ............. 526/329.2 |

(List continued on next page.)

OTHER PUBLICATIONS

Product Information; HTML www.probes.com; Molecular Probes, Inc.; revised Apr. 19, 1999 (2 pages).*

S.J. Bukofsky et al.; Imaging of photogenerated acid in a chemically amplified photoresist; *Applied Physics Letter* 73 No. 3:408–450 (Jul. 1998).

Primary Examiner—Janet Baxter
Assistant Examiner—Yvette M. Clarke
(74) Attorney, Agent, or Firm—Myers Bigel Sibley & Sajovec, P.A.

(57) ABSTRACT

A method of imaging acids in chemically amplified photoresists involves exposing to radiation a chemically amplified photoresist comprising a pH-dependent fluorophore. Upon exposure to radiation, such as deep-UV radiation, the chemically amplified photoresist produces an acid, which is then visualized by the fluorescence of the pH-dependent fluorophore. An image is generated from the fluorescence of the pH-dependent fluorophore, thus providing a map of the location of the acid in the photoresist. The images are able to be visualized prior to a post-exposure bake of the resist composition. Chemically amplified photoresists comprising pH-dependent fluorophores are useful in the practice of the present invention. The method finds particular use in examining the efficiency of photoacid generators in chemically amplified photoresists, in that it allows the practitioner the ability to directly determine the amount of acid generated within the photoresist.

15 Claims, 3 Drawing Sheets

U.S. PATENT DOCUMENTS

| | | | |
|---|---|---|---|
| 5,645,462 A | 7/1997 | Banno et al. | 445/51 |
| 5,646,411 A | 7/1997 | Kain et al. | 250/458.1 |
| 5,648,196 A | 7/1997 | Frecht et al. | 430/270.1 |
| 5,667,938 A | 9/1997 | Bantu et al. | 430/270.1 |
| 5,671,085 A | 9/1997 | Gustafsson et al. | 359/385 |
| 5,691,101 A | 11/1997 | Ushirogouchi et al. | 430/176 |
| 5,700,628 A | 12/1997 | Moslehi | 430/313 |
| 5,712,078 A | 1/1998 | Huang et al. | 430/270.1 |
| 5,733,705 A | 3/1998 | Bantu et al. | 430/270.1 |
| 5,830,619 A | 11/1998 | Chin et al. | 430/270.1 |
| 5,846,737 A | 12/1998 | Kang | 435/7.1 |
| 5,866,331 A | 2/1999 | Singer et al. | 435/6 |
| 5,874,219 A | 2/1999 | Rava et al. | 435/6 |
| 5,882,844 A | 3/1999 | Tsuchiya et al. | 430/288.1 |
| 5,928,841 A * | 7/1999 | Ushirogouchi et al. | 430/325 |

* cited by examiner

METHODS AND COMPOSITIONS FOR IMAGING ACIDS IN CHEMICALLY AMPLIFIED PHOTORESISTS USING PH-DEPENDENT FLUOROPHORES

STATEMENT OF FEDERAL SUPPORT

This invention was made with the support of the United States government under Grant No. N-00014-971-0460 from Defense Advanced Research Projects Agency (DARPA) and the Office of Naval Research (ONR). The Government has certain rights in this invention.

FIELD OF THE INVENTION

The present invention relates to the field of lithography and more specifically relates to the use of chemically amplified photoresists in lithography.

BACKGROUND OF THE INVENTION

Semiconductors are widely used in integrated circuits for electronics applications, including information systems. Such integrated circuits typically employ transistors and multiple levels of device interconnects fabricated in silicon. Various device layers may be sequentially formed on a semiconductor wafer using a combination of microlithography and etch processes.

Microlithography is a commonly practiced process of creating a patterned mask on the surface of a semiconductor wafer so that subsequent patterned processes may be performed. Typically these subsequent patterned processes involve the addition or subtraction of a material by deposition, implant doping, or plasma etching. Frequently, the pattern is transferred from an exposure mask to the wafer using a photoresist layer and optical lithography exposure tools.

Many modern semiconductor fabrication processes involve the deposition of a photosensitive resist material upon a substrate such as a wafer that may have various material layers formed upon it. The resist material is then exposed to radiation of a particular frequency. The radiation interacts with the resist material and produces a pattern within the resist, termed a "latent image."

There is a desire in the industry for higher circuit density in microelectronic devices that are made using lithographic techniques. One method of increasing the number of components per chip is to decrease the minimum feature size on the chip, which requires higher lithographic resolution. The use of shorter wavelength radiation (e.g., "deep" or "extreme" ultraviolet (UV), in the range of from about 190 to about 315 nm) offers the potential for higher resolution. However, with deep UV radiation, higher exposure doses may be required to achieve the desired photochemical response.

As the exposure wavelength of modern microlithographic tools continues to decrease, chemically amplified photoresists are becoming increasingly important. Several acid catalyzed chemically amplified resist compositions have been developed. Chemically amplified resist compositions generally comprise a photosensitive acid ("photoacid") generator (PAG) and an acid sensitive polymer. Upon exposure to radiation (e.g., x-ray radiation, ultraviolet radiation), the photoacid generator, by producing a proton, creates a photogenerated catalyst (usually a strong acid) during the exposure to radiation. During a post-exposure bake (PEB), the acid may act as a catalyst for further reactions. For example, the acid generated may facilitate the cross-linking in the photoresist. The generation of acid from the PAG does not necessarily require heat. However, many known chemically amplified resists require a post-exposure bake (PEB) of one to two minutes in length to complete the reaction between the acid moiety and the acid labile component. During this time, acid diffusion in the film can cause an undesirable effect if acid moieties migrate into unexposed regions.

Issues such as acid diffusion during bake steps can affect critical dimension and linewidth variation in a semiconductor. Accordingly, knowledge of the location, amount, and extent of diffusion of the photogenerated acid in the photoresist is crucial for understanding resist behavior. Since it can be extremely difficult to make optical contact with the acids directly, their location is generally inferred from scanning electron microscopy (SEM) images of developed patterns. These exposed images, however, are convolved with subsequent processes such as resist chemistry, baking, and chemical development. For this reason, it is desirable to have a method of detecting latent images in exposed photoresists which allows direct determination of acid location (i.e., without requiring additional baking or developing processes).

Previous studies of latent images have been undertaken with a variety of methods, including atomic force microscopy (see Ocola et al., *Appl. Phys. Lett.* 68, 717 (1996)), and photon tunneling microscopy (see Marchman and Novembre, *Appl. Phys. Lett.* 66, 3269 (1995); Liddle et al., *J Vac. Sci. Technol.* B 15, 2162 (1997)). These techniques rely on contrast mechanisms resulting from topographic and/or refractive index variations in exposed resist. It would be desirable, however, to have an imaging technique that is sensitive directly to the presence of the photogenerated acid molecules.

There is also a need to be able to evaluate whether or not a photoacid generator present in a chemically amplified photoresist is efficient (i.e., produces sufficient acid to catalyze the desired reaction). Similarly, there is a desire to be able to compare the efficiency of one photoacid generator to another. It is also desirable to be able to quantify the number of acid molecules generated by the photoacid generator upon exposure to radiation. Presently, these kinds of determination may be made by spectrophotometric titration (i.e., comparative onwafer absorbance measurements). However, this kind of measurement is generally very time consuming, and cannot be made with certain incident radiation (e.g., at 193 nm). A method that may be used with a broad range of radiation wavelengths, and which significantly reduces the amount of time required to make these determinations, is desirable.

SUMMARY OF THE INVENTION

It is an object of the invention to provide methods for imaging acids in a chemically amplified photoresist composition prior to post-exposure bake.

It is also an object of the invention to provide methods for imaging an acid in a chemically amplified photoresist by directly determining the location of the acid within the resist composition.

It is additionally an object of the present invention to provide methods for comparing the efficiency of photoacid generators.

It is yet another object of the invention to provide chemically amplified photoresist compositions that may be used to image the location of the acid generated in the photoresist composition during exposure to radiation.

It is yet another aspect of the invention to provide methods for measuring acid diffusion within a photoresist composition.

Accordingly, the present invention provides a novel method of imaging acid in a chemically amplified photoresist, by exposing to radiation a chemically amplified photoresist that generates acid when exposed to the radiation. The chemical amplified photoresist comprises at least one pH-dependent fluorophore that fluoresces in the presence of acid and when exposed to the radiation. The chemically amplified photoresist comprising a pH-dependent fluorophore may be made by adding an amount of pH-dependent fluorophore to a casting solution of a known chemically amplified photoresist composition. An image of the acid in the photoresist is then generated, preferably by fluorescent imaging. The chemically amplified photoresist may be applied to as substrate such as a silicon photoresist prior to exposure to radiation. The radiation may be ultraviolet (UV) radiation (including deep UV radiation), x-ray, or any other known means of radiation.. The pH-dependent fluorophore is preferably a rhodol derivative, although any pH-dependent fluorophore is useful in the practice of the present invention. The imaging of the acid in the chemically amplified photoresist provides a map of the location of acid generated in the photoresist.

The present invention also provides a method of making a chemically amplified photoresist, comprising admixing a polymeric resin, a photoacid generator, and a pH-dependent fluorophore. The polymeric resin may be, and preferably is, a novolak or novolak-based resin. The pH-dependent fluorophore is derivative of rhodol, and is more preferably one of the pH-dependent fluorophores Cl-NERF or DM-NERF.

The present invention further provides novel chemically amplified photoresist compositions that may be used for the detection and imaging of acids in the chemically amplified photoresist. These chemically amplified photoresists comprise a polymeric resin, a photoacid generator, and a pH-dependent fluorophore.

The invention also provides a method of measuring the amount of acid generated by a photoacid generator in a chemically amplified photoresist composition when the chemically amplified photoresist is exposed to radiation. This method involves exposing the chemically amplified photoresist composition to radiation, the photoresist composition comprising a photoacid generator and a pH-dependent fluorophore that fluoresces in the presence of an acid and when exposed to the radiation. The amount of the fluorescence generated by the chemically amplified photoresist is then detected with the amount of fluorescence correlating with the amount of acid generated by the photoacid generator.

A fluorescence-based technique for mapping pH gradients in chemically amplified photoresists is accordingly disclosed herein. The methods and compositions described herein are particularly advantageous in that they provide a way to directly measure the location and amount of acid in a chemically amplified photoresist. This feature allows the practitioner a spatial way to, for example, control the diffusion of acid into the chemically amplified photoresist. For example, if the method of imaging the acid in the photoresist indicates that diffusion of acid into the resist composition is too great, the practitioner may change the components in resist, or the amounts thereof, to limits the acid diffusion. Such control allows the practitioner a way to improve resolution in electronic microdevices such as, for example, integrated circuits and semiconductors.. Accordingly, the present invention is useful in the study of semiconductors generally, and in the study and optimization of semiconductor fabrication specifically.

This invention is particularly advantageous in that it allows for the study of latent images formed in the resist, after exposure to radiation but without baking (i.e., PEB) or developing the resist, for almost any lithographic technique used in the semiconductor industry today. In addition, this technique has the potential for the rapid determination of photogenerated acid yield among a variety of photoacid generators. Due to the relatively low level of pH-dependent fluorophore required and high signal to noise ratio, the methods may also be used for photoacid yield determination in resists without altering the absorbance characteristics of the film. This is especially important in 193 nm lithography, or exposures using extreme ultraviolet lithography where the exposure depth is only about 200 nm.

These and other aspects and object of the invention, and the equivalents thereof, are described in further detail in the drawings and descriptions that follow.

BRIEF DESCRIPTION OF HE DRAWINGS

FIG. 2B is a photographic image formed by x-ray exposure of 0.5 $\mu$m SAL605® film. It illustrates a 10×10 $\mu$m latent image, formed by the pH-dependent fluorescence of Cl-NERF. The fluorescence in the exposed regions has been reduced by the formation of photogenerated acid molecules.

Figure 3:
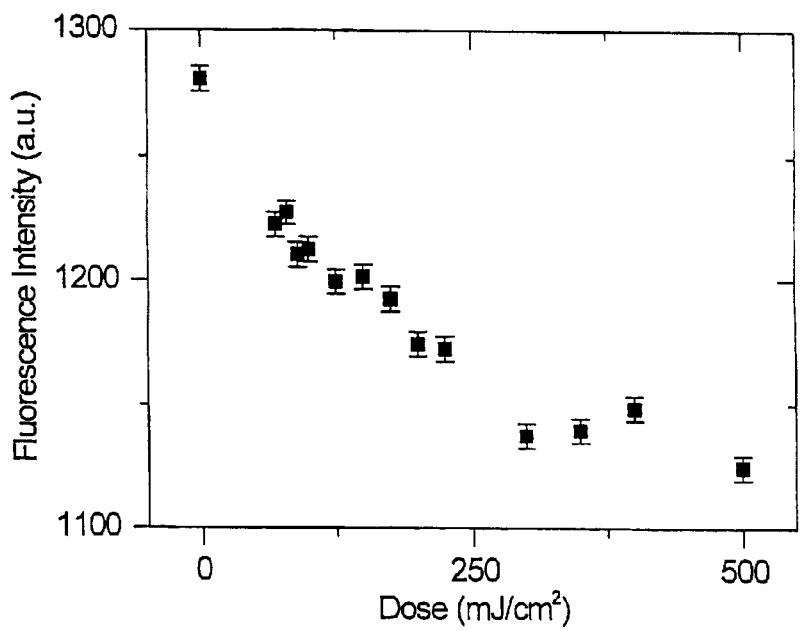

FIG. 3 is a graphical illustration of fluorescence v. dose for a 0.5 $\mu$m thick SAL605® film with 0.07 wt % Cl-NERF added. The error bars represent a ±0.5 $\mu$% uncertainty in the laser power during the measurement.

DETAILED DESCRIPTION OF THE PREFERRED EMBODIMENTS

The present invention now will be described more fully hereinafter with reference to the accompanying drawings and examples, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Unless otherwise defined, all technical and scientific terms used herein have the same meaning as commonly understood by one of ordinary skill in the art to which this invention belongs. All publications, patent applications, patents, and other references mentioned herein are incorporated by reference in their entirety.

As used herein, the term "imaging an acid" means creating an image that shows the location of acid molecules in a chemically amplified photoresist. Acid molecules are generated in a chemically amplified photoresist when the chemically amplified photoresist generates a catalyst (generally, an acid, although other catalysts may be generated and detected by the methods of the present invention) upon exposure of the chemically amplified photoresist to radiation (e.g., x-ray, ultraviolet, infrared, e-beam, I-beam, and the like). As used herein, the term "acid" includes acids as known in the art, as well as catalysts generated in a chemically amplified photoresist when the photoresist is exposed to radiation.

Fluorescence is a physical phenomenon based upon the ability of certain molecules to absorb and emit light at different wavelengths. The absorption of light (photons) at a first wavelength is followed by the emission of photons at a second wavelength and different energy state. "Fluorophores" are substances which release or emit fluorescent light; namely, they "fluoresce". As used herein, a "pH-dependent fluorophore" is a fluorescent dye that emits light when exposed to radiation at a specific wavelength, and of which the emission intensity corresponds in a predictable way with the pH of the local environment, with intensity of the emission being a function of the pH.

In the present invention, the imaging of an acid in a chemically amplified photoresist occurs because the chemically amplified photoresists of the present invention comprise at least one pH-dependent fluorophore. Upon exposure of the chemically amplified photoresist to radiation, the pH-dependent fluorophore fluoresces in the presence of an environment of a particular pH (i.e., in an acidic local environment created by the production of an acid in the resist), and if the radiation that the photoresist is exposed to is of a wavelength that allows the fluorophore to fluoresce, i.e., a wavelength absorbed by the fluorophore, which absorption causes the fluorophore to emit light.

The term "photoresist" is used interchangeably herein with the term "resist." Photoresists of the present invention may be negative (or negative-tone) photoresists, or positive (or positive-tone) photoresists, as those terms are known in the art. Photoresists of the present invention are chemically amplified photoresists, by which is meant that the photoresist composition comprises a photosensitive acid (or photoacid) generator, or PAG. Upon exposure of the chemically amplified photoresist to radiation, one photon or energetic particle is absorbed by the PAG, which produces an acid molecule that subsequently may cause or catalyze numerous chemical events, or may cause or catalyze individual cleavage reactions of acid labile groups in the chemically amplified photoresist. The acidic molecules may be considered catalysts, because the acid may be regenerated after each of many individual reactions.

Chemically amplified photoresists of the present invention will comprise at least one pH-dependent fluorophore, as defined herein. In one embodiment of the invention, the pH-dependent fluorophore is added (e.g., by admixture) to a solution of a known chemically amplified photoresist (i.e., a casting solution), thus forming a chemically amplified photoresist solution comprising a pH-dependent fluorophore. Chemically amplified photoresists typically comprise a polymeric resin or binder admixed with a photoacid generator. Chemically amplified photoresists useful in the practice of the present invention are known in the art, and are disclosed in, for example, U.S. Pat. No. 5,882,844 to Tsuchiya et al., U.S. Pat. Nos. 5,492,793 and 5,625,020 to Breyta, U.S. Pat. No. 5,712,078 to Huang et al., U.S. Pat. No. 5,252,435 to Tani et al., U.S. Pat. No. 5,258,257 to Sinta et al., U.S. Pat. No. 5,352,564 to Takeda et al., U.S. Pat. No. 4,491,628 to Ito, et al., U.S. Pat. No. 4,946,759 to Doessel, et al., U.S. Pat. No. 4,946,760 to Elsaesser and U.S. Pat. No. 5,210,000 to Thackeray et al., all of which are herein incorporated by reference in their entirety. Other chemically amplified photoresists useful in the practice of the present invention are described in Nalamasu et al., "An Overview of Resist Processing for Deep-UV Lithography", *J. Photopolym. Sci. Technol.* 4, 299 (1991); Y. Jiang and D. Bassett, "Chemically Amplified Deep UV Photoresists Based On Acetal-Protected Poly(vinylphenols)," *Proc. Amer. Chem. Soc., Div. Polym. Mater. Sci. Eng.*, 66, 41 (1992); Hayashi, et al., "Tetrahydropyranyl and Tetrahydrofuranyl Protected Polyhydroxystyrenes in Chemical Amplification Resist Systems for KrF Excimer Laser Lithography," *Proc. Amer. Chem. Soc., Div. Polym. Mater. Sci. Eng.*, 61, 417, (1989); Hayashi, et al., "Polyvinylphenols Protected With Tetrahydropyranyl Group in Chemical Amplification Positive Deep UV Resist Systems," *SPIE, Adv. Resist Technol. and Process. VIII*, 1466, 377, (1991); and S. Hesp, et al., "Tetrahydropyranyl and Tetrahydrofuranyl Protected Polyhydroxystyrene in Chemical Amplification Systems," *J Appl. Polym. Sci.*, 42, 877, (1991), the disclosures of which are incorporated herein by reference in their entirety.

As provided above, in one embodiment of the invention, the chemically amplified photoresist composition comprising the pH-dependent fluorophore may be made by adding appropriate amounts of the pH-dependent fluorophore to a known chemically amplified photoresist solution (i.e., may be added to a known chemically amplified photoresist casting solution). In an alternative embodiment of the invention, a chemically amplified photoresist solution or composition useful in the practice of the present invention may be made by the skilled artisan, the chemically amplified photoresist comprising a polymeric resin, a photoacid generator, and a pH-dependent fluorophore.

The polymeric resins that are useful in making the chemically amplified photoresists of the present invention include film-forming polymers having recurrent hydroxyl groups chemically linked thereto and derivatives thereof. Typically, suitable polymers include polymers containing ethylenic unsaturation or aromatic rings. Examples of useful polymers include, but are not limited to, poly(hydroxystyrene), novolak, poly(p-t-butyoxycarbonyloxy-styrene), polyvinylbenzoic acid, poly(2-hydroxyhexafluoropropyl styrene), copolymers of styrene and hydroxystyrene, copolymers of styrene and maleimide as described in S. R. Turner et al., *Polym. Sci & Eng.* 26, 1096 (1986), the disclosure of which is incorporated herein by reference in its entirety, copolymers of styrene and t-butoxycarbonyloxystyrene, copolymers of hydroxystyrene and t-butoxycarbonyloxystyrene, and mixtures or copolymers of any two or more of the foregoing polymers. Preferably, the polymer resin is poly (hydroxystyrene), poly(t-butoxycarbonyloxystyrene) or novolak.

Examples of preferred polymers include hydroxyaromatic polymers which are the condensation reaction product of a substituted or unsubstituted phenol with an aldehyde. By hydroxyaromatic polymers is meant those polymeric compositions comprising a substituted or unsubstituted phenol, naphthol, or congeneric groups having a hydroxyl group directly bonded to an aromatic ring, wherein the aromatic ring may be pendent from the polymeric backbone or may be in the polymeric chain. Preferred polymers also include polymers or copolymers derived from a substituted or unsubstituted hydroxystyrene, by which is meant that the polymers or copolymers have an aliphatic or partially aliphatic polymer backbone and have hydroxyaromatic groups pendent therefrom. Examples of more preferred polymers include novolak resins, and polymers which are the condensation reaction product of formaldehyde with phenol or an alkylphenol, and polyhydroxystyrene. In an alternate embodiment, the polymer may be a copolymer derived from a substituted or unsubstituted hydroxystyrene and an olefinically substituted cyclic alcohol. In an alternate preferred embodiment, the polymer may be poly(hydroxystyrene-co-vinyl cyclohexanol) which is described in U.S. Pat. No. 5,128,232 to Thackeray, the disclosure of which is incorporated herein by reference in their entirety.

For example, novolak-based resins may be employed such as, but not limited to, those taught in U.S. Pat. No.

4,294,911, to Guild, the disclosure of which is incorporated herein by reference in its entirety. The novolak-based resins may be prepared using conventional techniques. For example, the novolak-based resins may be prepared by the condensation of phenols and aldehydes under acidic conditions. In a typical synthesis, the novolak-based resins are prepared by heating one mole of phenol with 0.5 µmole of formaldehyde under acidic conditions. The temperatures under which the reaction is conducted may range from about 25° C. to about 175° C.

More particularly, the novolak-based resins may be prepared by the condensation of phenol with formaldehyde, more generally by the reaction of a phenolic compound having two or three reactive aromatic ring hydrogen positions with an aldehyde or aldehyde-liberating compound capable of undergoing phenol-aldehyde condensation. Illustrative of particularly useful phenolic compounds are cresol, xylenol, ethylphenol, butylphenol, isopropylmethoxyphenol, chlorophenol, resorcinol, hydroquinone, naphthol, 2,2-bis(p-hydroxyphenyl) propane, and the like. Examples of aldehydes which may be employed include, but are not limited to, formaldehyde, acetaldehyde, acrolein, crotonaldehyde, furfural, and the like. An example of an aldehyde-liberating compound which may be used includes, but is not limited to, 1,3,5-trioxane. Ketones such as acetone are also capable of condensing with the phenolic compounds. Preferred phenolic resins include cresol-formaldehyde and phenol-formaldehyde.

The chemically amplified photoresists of the present invention will comprise a photoacid generator (PAG). PAGs used in the photoresist composition as used in the practice of the present invention can be any of a variety of compounds that can generate an acid upon exposure to light energy, such as nitrobenzyl compounds, onium salts (e.g., triphenyl sulfonium salts such as triphenyl sulfonium triflate), sulfonic acid compounds, and carbonic acid compounds. Such photoacid generators include: 4,4'-isopropylidene bis(2,6-dibromophenol); 1,1-bis [p-chlorophenyl]-2,2,2-trichloroethane (DDT); 1,1-bis [p-methoxyphenyl]-2,2,2-trichloroethane (Methoxychlor®); 1,2,5,6,9,10-hexabromocyclododecane; 1,10-dibromodecane; 1,1-bis[p-chlorophenyl]-2,2-dichloroethane; 4,4'-dichloro-2-(trichloromethyl)benzhydrol or 1,1-(chlorophenyl)2-2,2-trichloroethanol (Kelthane®); hexachlorodimethylsulfone; 2-chloro-6-(trichloromethyl)pyridine; O,O-diethyl-O-(3,5,6-trichloro-2-pyridyl)phosphorothioate (Dursban®); 1,2,3,4,5,6-hexachlorocyclohexane; N(1,1-bis [p-chlorophenyl]-2,2,2-trichoroethylacetamide, tris[2,3-dibromopropyl] isocyanurate; 2,2-bis [p-chlorophenyl]-1,1-dichloroethylene; 2,2,2-tribromoethanol; and their isomers, analogs, homologs and residual compounds.

Photoacid generators useful in the practice of the present invention include, without limitation, metallic, metalloid, and non-metallic onium salts of which examples are described in U.S. Pat. No. 4,102,687 to Crivello, aryl sulfonates including without limitation, tris-pyrogallol sulfonates and anthracene-2-sulfonates such as 9,10-diethylanthracene-2-sulfonate, 2-nitrobenzyl esters, beta-ketosulfones, disulfones, arylsulfonyl-alpha-keto- and alpha-carboxyl- diazomethanes, and precursors of substituted and unsubstituted sulfonic acids. Other photoacid generators are described in U.S. Pat. No. 5,258,257 to Sinta et al. U.S. Pat. No. 4,371,605, to Renner et al., and in Shirai, et al., "Synthesis and Photo-Induced Dissolution of Polymers Bearing Imino Sulfonate Groups," *J Polym. Sci. A,* 27, 325 (1989), the disclosures of which are incorporated herein in their entirety.

Additional examples of photoacid generators useful in the practice of the present invention include N-(trifluoromethylsulfonyloxy)-bicyclo-[2.2.1]hept-5-ene-2,3-dicarboximide (MDT), N-(trifluoromethylsulfonyloxy) nitronaphthalimides, N-(trifluoromethylsulfonyloxy)-4-halonaphthalimides, N,N'-bis(camphorsulfonyloxy)-3,4,9,10-perylenetetracarbox-diimide, N-(trifluoromethylsulfonyloxy)-7-oxabicyclo-[2.2.1]hept-5-ene-2,3-dicarboximide, N-(trifluoromethylsulfonyloxy)-succinimide, N,N,'-bis(trifluoromethylsulfonyloxy)-(3-methyl-4,5-i mido-cyclohex-3-enyl)-succinimide, N-(trifluoromethylsulfonyloxy)-diphenylmaleimide, di-[N-(trifluoromethylsulfonyloxy)-phthalimidyl]ether, bistrifluoromethyl-bis-N, N-(trifluoromethylsulfonyloxy)-phthalimidylmethane,N-(camphorsulfonyloxy) naphthalimide,N-(camphorsulfonyloxy)-nitronaphthalimides, and thecorresponding tosyl-, brosyl-, fluoro- and perfluoro-benzenesulfonyloxy-, nitrobenzenesulfonyloxy-, and halobenzenesulfonyloxy-analogs thereof. It will be understood that other photoacid generators known in the art will be useful in the practice of the present invention.

The photoacid generator will be selected to respond to the light energy used for exposing the chemically amplified photoresist. Photoacid generators are currently available for a variety of different wavelengths from visible to X-ray; accordingly, the artisan will select the appropriate photoacid generator based on their knowledge of the kind of radiation that the photoresist will be exposed to. The photoacid generator will preferably comprise about 0.01 to about 20% by weight of the photoresist composition, and most preferably less than about 10% by weight of the photoresist composition.

In addition to the polymeric resin and the photoacid generator, the photoresist compositions may also comprise light-sensitive components such as, for example, a quinone diazide moiety which can either be condensed with the resin, or admixed with the resin in the form of a monomer, or is present both as part of the resin and as the monomer admixed therewith. Examples of these components and techniques for using them in conjunction with the resists can be found in U.S. Pat. Nos. 4,294,911 to Guild and U.S. Pat. No. 4,423,138 to Guild, the disclosures of which are incorporated herein by reference in their entirety.

The chemically amplified photoresist compositions may also include non light-sensitive compounds (e.g., polymeric binders such as alkyl methacrylates) in amounts known to one skilled in the art. Dyes, pigments, surfactants, stabilizers, additional photoactive compounds, and the like, all of which are conventional and known in the art, may also be employed.

Chemically amplified photoresists of the present invention will comprise at least one pH-dependent fluorophore. Virtually any fluorophore that is pH-dependent can be utilized in the practice of the present invention, the selection of which fluorophore may be made by the skilled practitioner. Certain pH-dependent fluorophores exhibit a decrease in fluorescence intensity with increasing acidity, while others exhibit an increase in fluorescence intensity with increasing acidity; either kind of fluorophore is useful in the practice of the present invention.

Many pH-dependent fluorophores are known in the art. An extensive list of readily-available fluorescent pH indicators covering the pH range of 0 to 14 is provided by G. G. Guilbault in "Practical Fluorescence" (1973), and in Whitaker et al., *Anal. Biochem.* 207, 267 (1992), both incorporated herein in their entirety. Others pH-dependent fluorophores useful in the practice of the present invention are described in U.S. Pat. No. 4,945,171 to Haugland et al., U.S. Pat. No. 5,387,527 to Sternberg, U.S. Pat. No. 4,774,339 to Haugland et al, and U.S. Pat. No. 5,302,731 to Pitner et al., the disclosures of which are also incorporated herein in their entirety. Particularly preferred pH-dependent fluorophores useful in the practice of the present invention are disclosed in U.S. Pat. Nos. 5,227,487 and 5,442,045 to Haugland et al., the disclosures of which are incorporated herein in their entirety. An extensive list of commercially available pH-dependent fluorophores useful in the practice of the present invention is found in R. P. Haugland, Chapter 23 ("pH Indicators") of Handbook of Fluorescent Probes and Research Chemicals, Sixth Edition (Molecular Probes, Inc. Eugene, Ore., (1996), and HTML version located at www.probes.com)., incorporated herein by reference in its entirety, and hereinafter referred to the "Handbook."

Certain pH-dependent fluorophores useful in the practice of the present invention are available from Molecular Probes, Inc. (Eugene, Oreg.), and include rhodols and derivatives thereof, including NERF dyes (e.g., Rhodol Green, DM-NERF, Cl-NERF, also referred to as R-6152, D-6830, and C-6831, respectively, in the Handbook); SNAFL indicators (e.g., SNAFL-1 and SNAFL-2, also referred to as C-3061 and C-3062, respectively in the Handbook); SNARF-1 (also referred to as C-1270 in the Handbook); ACMA (also referred to as A-1324 in the Handbook); HPTS (pyranine, also referred to as H-348 in the Handbook); BCECF (referred to as B-1151 in the Handbook), fluorosceins and carboxyfluorosceins (e.g., naphthofluoroscein, dichlorofluoroscein, dimethylfluoroscein carboxyfluoroscein, also referred to as C-653, D-6078, C-366, and C-1311, respectively, in the Handbook); Oregon Green® dyes (e.g., Oregon Green 488, Oregon Green 500, Oregon Green 514, also referred to as O-6147, O-6136, and O-6139, respectively, in the Handbook); LysoSensor™ compounds (e.g., LysoSensor Blue DND-192, LysoSensor Blue DND-167, LysoSensor Green DND-153, LysoSensor Green DND-189, and LysoSensor Yellow/Blue DND-160, also referred to as L-7532, L-7533, L-7534, L-7535, and L-7545, respectively in the Handbook); 4',5'-Dichloro-2',7'-dimethoxyfluorescein (JOE, also referred to as D-12980 in the Handbook); the derivatives of the foregoing, and the dextran conjugates of the foregoing. In a preferred embodiment of the invention, the pH-dependent fluorophore is a rhodol derivative; more preferably, the pH-dependent fluorophore is Cl-NERF or DM-NERF, each available from Molecular Probes, Inc. (Eugene, Oreg.). Cl-NERF and DM-NERF are disclosed in U.S. Pat. No. 5,227,487 to Haugland et al. (hereinafter the '487 patent), incorporated by reference above. Cl-NERF is compound 8 in the '487 patent, while DM-NERF is compound 12 in the '487 patent. In the '487 patent, compound 12 (DM-NERF) is generically named "5-(and-6)-carboxy-2',7'-dimethyl-3'-hydroxy-6'-N-ethylamino-spiro[isobenzofuran-1(3H),9'-[9H]xanthen-3-one." Based on this naming convention, compound 8 (Cl-NERF) may be referred to as "5-(and-6)-carboxy-2'-chloro, 7'- dimethyl-3'-hydroxy-6'-N-ethylamino-spiro [isobenzofuran-1(3H),9'-[9H] xanthen-3-one."

In selecting the appropriate pH-dependent fluorophore to be used in the practice of the present invention, the artisan will understand that the pKa of the fluorophore will properly match the pH of the chemically amplified photoresist. The pKa of the fluorophore will preferably be within about one pH unit of the chemically amplified photoresist, more preferably within about 0.5 μpH unit of the chemically amplified photoresist, and most preferably within about 0.25 pH unit of the chemically amplified photoresist. Another consideration that will be taken into account by the skilled practitioner in selecting the proper pH-dependent fluorophore is that the fluorescence intensity of the compound be correlated as reliably as possible with the pH of the medium being measured (i.e., the chemically amplified photoresist).

The practitioner may select more than one pH-dependent fluorophore to be incorporated into the chemically amplified photoresist. For example, the practitioner may choose one pH-dependent fluorophore that fluoresces at a particular pH, and then another pH-dependent fluorophore that fluoresces at a different pH, in order to more precisely measure the amount and kind of acid produced by exposing the chemically amplified photoresist to radiation. Similarly, the practitioner may elect to incorporate one pH-dependent fluorophore that fluoresces when exposed to a particular radiation wavelength, and also incorporate another pH-dependent fluorophore that fluoresces at a different radiation wavelength, thus allowing the practitioner the flexibility to examine the behavior of the chemically amplified photoresist under different radiation exposure conditions.

The amount of pH-dependent fluorophore or fluorophores in the chemically amplified photoresist will comprise in total, by weight percentage, at least about 0.001 weight percent (%) of the chemically amplified photoresist composition, preferably at least about 0.005 weight percent (%) of the chemically amplified photoresist, and most preferably at least about 0.01 weight percent (%) of the chemically amplified photoresist. The pH-dependent fluorophore may comprise, by weight percentage, as much as about 0.5 μweight % of the chemically amplified photoresist, preferably as much as about 0.1 weight percent (%) of the chemically amplified photoresist, and most preferably as much as about 0.07 weight percent The chemically amplified photoresist comprising a pH-dependent fluorophore may be provided alone, as a sheet or film. More preferably, the photoresist is formed on a microelectronic substrate. Suitable substrates are known to those skilled in the art. For example, the chemically amplified photoresist may be formed as a coating on a monocrystalline silicon or other semiconductor substrate. Other suitable substrates include printed circuit boards or other second level packaging substrates.

In accordance with conventional techniques, the chemically amplified photoresist is preferably first applied onto a substrate such as, for example, a silicon wafer. The substrate and its surface preferably form a rigid support on which the sample can be formed. The substrate may be functionalized glass, Si, Ge, GaAs, GaP, $SiO_2$, $SiN_4$, modified silicon, or any one of a wide variety of gels or polymers such as (poly)tetrafluoroethylene, (poly)vinylidenedifluoride, polystyrene, polycarbonate, polypropylene, or combinations thereof. The chemically amplified photoresist is applied to a substrate surface by spinning, dipping, or other conventional coating techniques. Spin coating is particularly suitable for depositing an adherent, uniform film on the surface of the substrate. The chemically amplified photoresist may be irradiated using a suitable mask, or may be irradiated without a mask (i.e., the technique may be used in bulk exposure without a mask). The manner of preparing the chemically amplified photoresist and coating in onto a substrate or support, and then applying the composition of the invention thereto, is carried out by using procedures which are known to one who is skilled in the art.

Any well-known lithography may be used to form a resist pattern from a positive resist composition of the invention.

For example, the chemically amplified photoresist composition may be spin coated onto a silicon wafer and then may be pre-baked to induce crosslinking reaction between the base resin and the vinyl ether group-containing compound. Prebaking conditions should be sufficient for crosslinking reaction to take place and generally include a temperature of about 60° to about 150° C. and a time of about 1 to about 30 minutes. The resulting resist film is generally about 0.1 to about 2 µm thick.

In order to visualize the location of acid in the chemically amplified photoresist (for example, after the photoresist has been coated onto a substrate such as a silicon wafer), the photoresist is exposed to radiation of any kind, including but not limited to infrared, ultraviolet (UV) (including near-UV, mid-UV, and deep-UV), electron beam (e-beam), ion beam, and X-ray. As used herein, the term "radiation" is used to refer to, but is not limited to, the aforementioned forms or sources of radiant or light energy. The artisan will appreciate that other radiation sources known in the art will also be useful. Exposure of the chemically amplified photoresist to radiation causes the photoacid generator to generate an acid, as explained herein. In one preferred embodiment of the invention, the chemically amplified photoresists of the present invention are exposed to deep ultraviolet (UV) radiation. Deep UV is considered to be ultraviolet light having a wavelength in the range from about 180 nm to about 300 nm. The chemically amplified photoresist may be exposed to radiation using any apparatus or method known in the art.

After being exposed to radiation, an image of the acid in the photoresists is generated. The acid is produced by the creation of a proton due to exposure to the radiation, as described herein. In response to the exposure to the radiation and the presence of local acidic conditions, the pH-dependent fluorophore fluoresces (i.e., emits light), and the fluorescence emission of the pH-dependent fluorophore is used to generate the image. The fluorescence from the pH-dependent fluorophore is then imaged and interpreted as a map of the local pH of the resist. The fluorescent image is generated using standard spectroscopic imaging techniques, as explained herein. In that there is no bake or chemical development required to visualize the acid in the photoresist, the imaging of the present invention is considered "latent" imaging.

The image of the acid in the photoresist may be generated using any means of visualizing fluorescence in the art, including but not limited to fluorescence detection microscopy (e.g., confocal fluorescence microscopy, digital fluorescence microscopy), and more preferably digital imaging fluorescence microscopy. The apparatus used for irradiating the photoresist may be the same apparatus as that which generates the image, or may be a separate apparatus, or may comprise a part of the apparatus used to generate the image. In a preferred embodiment, the apparatus that irradiates the photoresist is the same as the apparatus that generates the image.

Digital imaging fluorescence microscopy is known in the art. Complete digital imaging fluorescence microscopy systems, or components for assembly of a complete system, are commercially available. A basic digital imaging fluorescence microscopy system includes the following operationally linked components: (1) a conventional fluorescence microscope, (2) a means for optical sectioning, e.g., a micrometer, (3) an optical detector, e.g., a CCD camera, and (4) a digital computer to store optical data. The foregoing basic components are commercially available. The operational linkage of the basic components is within ordinary skill in the art. Moreover, complete digital imaging fluorescence microscopy systems are commercially available. Suitable apparatus useful in the generation of the image are disclosed in, for example, U.S. Pat. No. 5,866,331 to Singer et al., U.S. Pat. No. 5,504,336 to Noguchi et al., U.S. Pat. No. 5,874,219 to Rava et al. Methods and published software for data analyses carried out in the practice of the present invention are known in the art.

In one embodiment of the present invention, the fluorescence produced by the pH-dependent fluorophore is detected, and is then digitally recorded as a series of optical sections. A series of Raman holographic or notch filters can be used in the optical path to eliminate the excitation light while allowing the emission to pass to the detector. From these optical sections a prepared image may be prepared. As used herein, "prepared image" means an image subjected sequentially to: (1) dark current subtraction, (2) background subtraction, and (3) normalization to the first optical section. As used herein, "background subtraction" means removal of light-dependent noise after dark current subtraction, while "dark current subtraction" means the removal of artifacts caused by electrical current in a CCD in the absence of light. From the prepared image, a restored image may be prepared. As used herein, "restored image" means a prepared image whose out-offocus light has been reassigned to its point source. The restored image can be produced by subjecting a prepared image to exhaustive photon reassignment or (EPR).

EPR may be used when a highly sensitive charge-coupled device (CCD) camera is used to collect light (i.e., fluorescence produced by the pH-dependent fluorophore) from a fluorescence microscope. The collected light is recorded as a series of optical sections from a sample. Much of the light in any given optical section is out-of-focus light that has spread from numerous individual point sources. Therefore, an unprocessed optical section is inevitably convoluted, and image resolution is diminished accordingly. Using a standard 3D image restoration algorithm known as exhaustive photon reassignment ("EPR"), a restored (i.e., deconvoluted) image is generated from a series of optical sections. EPR reassigns all of the collected light in a series of optical sections to the original point sources of the light. In addition to enhancing resolution, EPR enhances the sensitivity of detection, because it utilizes all of the light collected. EPR is a standard mathematical technique used to generate a restored image from a series of optical sections and is described by Carrington et al. in U.S. Pat. No. 5,047,968, incorporated herein in its entirety. EPR can be carried out on a conventional computer system, using commercially available software.

In another embodiment, collection optics direct the fluorescence emission to a spectrograph which images an emission spectrum onto a 2-dimensional array of light detectors. By using a spectrograph, a full spectrally resolved image of the sample may be obtained.

A computer can transform the data of the optical collection into another format for presentation. Data analysis can include the steps of determining, e.g., fluorescent intensity as a function of acid position in the photoresist from the data collected, and removing "outliers" (data deviating from a predetermined statistical distribution). The resulting data can be displayed as an image with color in each region varying according to the light emission.

As will be appreciated by those skilled in the art, the present invention may be used to determine the efficiency of photoactive generators (i.e., determine how much acid is produced by the photoacid generators present in a chemically amplified photoresist). Additionally, the skilled practitioner will be able to compare the relative efficiencies of a plurality of photoacid generators using the methods and chemically amplified photoresists of the present invention. In one embodiment of this invention, a chemically amplified photoresist comprising a pH-dependent fluorophore comprises a photoacid generator whose efficiency is desired to be examined. The chemically amplified photoresist comprising the photoacid generator and the pH-dependent fluorophore is then exposed to radiation, and the fluorescence emitted by the pH-dependent fluorophore is detected and measured according to fluorescence detection techniques known in the art, including the spectrofluorometric techniques set forth above. The measure of the fluorescence is then correlated to the amount of acid generated by the photoacid generator. In comparative studies, several samples of chemically amplified photoresists, each containing a different photoacid generator or a different amount (concentration) of photoacid generator, may be examined by the techniques set forth herein. In a another preferred embodiment, a chemically amplified photoresist comprising a pH-dependent fluorophore is applied to a substrate (e.g., a silicon wafer), and different amounts or different kinds of photoacid generators (i.e., different samples) are applied to different sections of the wafer (i.e., a dose matrix is constructed), according to techniques known in the art. The substrate with the chemically amplified photoresist is then exposed to radiation, and the fluorescence generated by the pH-dependent fluorophore for each sample detected and measured according to techniques known in the art. The fluorescence intensities of each sample is compared to the others, the results providing a comparative illustration of the relative efficiency of the photoacid generator of each sample.

After exposure of the chemically amplified photoresist to radiation and imaging of the acid generated therein, the chemically amplified photoresist may optionally be baked at, for example, from about 70° to about 150° C. for about 60 to about 120 seconds (post-exposure baking, or PEB) whereby the acid may, for example, catalyze the decomposition of acid labile group and/or the crosslinking. In typical semiconductor processing, photoresist material containing latent images may be processed through a number of subsequent steps, and either the exposed or unexposed portion of the resist material is then removed using either wet or dry techniques. (Whether the exposed or unexposed material is removed depends on whether the resist is a "positive" or "negative" resist.) Typical subsequent semiconductor processing often involves steps, such as etching, ion implantation, or chemical modification of the substrate material from which the photoresist has been removed. Any of these post-radiation exposure steps may optionally be performed on the chemically amplified photoresists of the present invention.

The invention will now be described in greater detail with reference to the examples which follow. It should be understood that the examples are set forth only to illustrate the invention, and are not meant as a limitation thereof.

EXAMPLE 1

The experiments described herein were performed on an undyed formulation of the electron-beam/x-ray, negative tone, chemically-amplified photoresist composition SAL605® (T. H. Fedynyshyn et al., *J. Vac. Sci. Technol. B* 8, 1454 (1990) and similar formulations (available from Shipley Company, Inc., Marlborough, Mass.). A small amount (from 0.001% (weight percent) to 1% (weight percent)) of pH-dependent fluorescent material was added to the photoresist casting solution. Since the as-spun pH of the SAL605® films is slightly acidic (effective pH=4), a fluorophore with an appropriate pKa was selected. The fluorophore selected for use in the experiments described herein was the rhodol derivative Cl-NERF (pKa=3.8 in water) (Molecular Probes, Inc., Eugene, Oreg.), whose fluorescence intensity is reduced in the presence of acids.

The chemically-amplified photoresist containing the pH-dependent fluorophore was the processed in a standard fashion. Specifically, the pH-dependent fluorophore was added to the resist casting solution prior to spin coating the resist on the wafer. The wafers were then baked at 118° C. for 72 seconds.

The chemically amplified photoresist was illuminated with the 514 nm line of an argon-ion laser, using a 0.8 NA 100× microscope objective. After exposure, locations where acid molecules were created exhibit lower fluorescence, revealing the latent image. The resist itself is insensitive to this wavelength; accordingly, only the fluorophores were excited. The fluorescence was collected with the same optic, and then imaged onto an avalanche photodiode. Two holographic notch filters removed the pump wavelength from the detector. The background signal on the detector was dark-count limited at approximately 20 counts/s, while the measured fluorescence was orders of magnitude larger. The wafer sat on a scanning platform which was controlled by a computer. Images were formed by rastering the wafer through the pump beam and collecting the fluorescence at each point.

Figure 1:
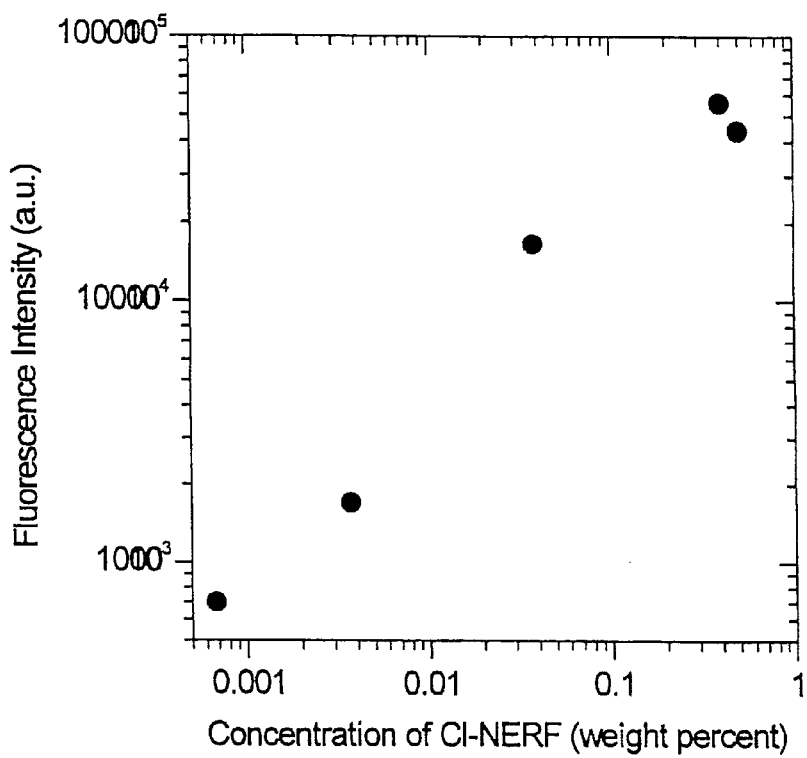
FIG. 1 is a graphical illustration of fluorescence intensity as a function of the concentration of the pH-dependent fluorophore Cl-NERF in 0.5 $\mu$M thick SAL605® films.

FIG. 1 shows the results of adding various amounts of Cl-NERF to 0.5 µm SAL605® films; each data point is the average of 50 measurements. The intensity of fluorescence increased as more fluorophores are added to the films, but drops off at high percents. This effect was attributed to self-quenching of the fluorophores when the intermolecule spacing was less than approximately 10 nm. For the remainder of the studies described herein, approximately 0.07% (weight percent) of the pH-dependent fluorophore Cl-NERF in the resist film was used.

EXAMPLE 2

Figure 2:
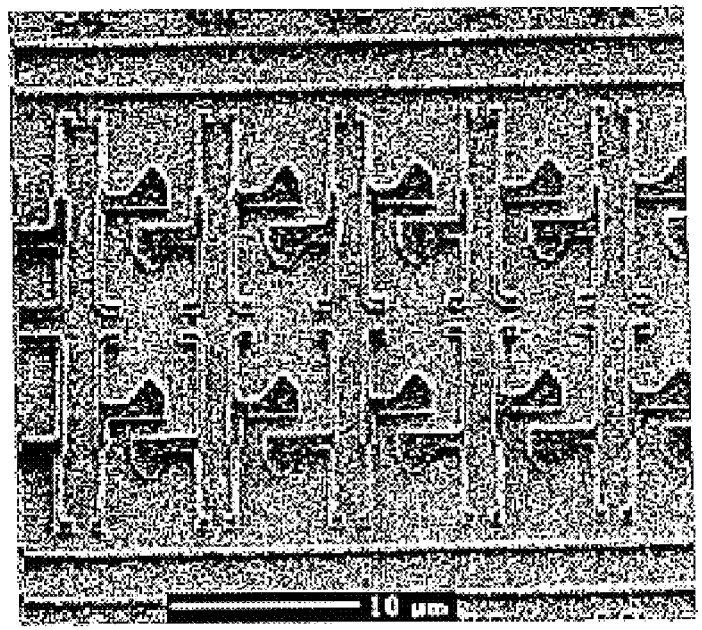
FIG. 2A is a photographic image formed by x-ray exposure of 0.5 $\mu$m SAL605® film. It illustrates an SEM image of developed photoresist; the smallest features on the mask are 0.25 $\mu$m lines.
Figure 2:
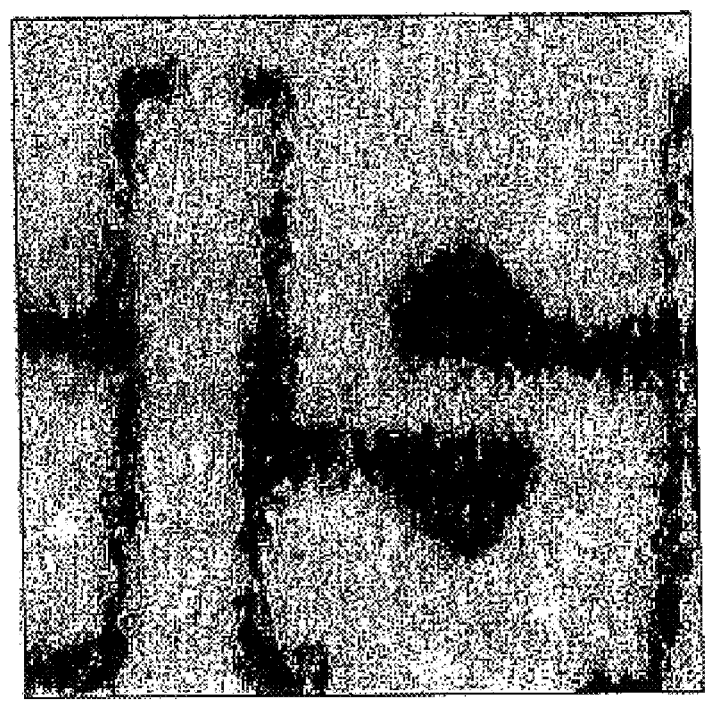

The samples used to test whether the pH-depended fluorescence of Cl-NERF could reveal latent images were 4 in. wafers coated with 0.5 µm thick resist films. The wafers were exposed at various doses on an x-ray stepper at the Synchrotron Radiation Center of the University of Wisconsin, and then imaged on the fluorescence microscopy detection and imaging apparatus at Yale University (Department of Applied Physics, laboratory of Dr. Robert Grober). FIG. 2A shows a SEM image of exposed and developed photoresist. FIG. 2B shows a latent image acquired by fluorescence microscopy with a pump power of 50 nW. The image is 10 µm on a side, and consists of 100×100 pixels acquired at 100 Hz. The difference in fluorescence between exposed and unexposed regions is approximately 20% for an exposure dose of 350 mJ/cm$^2$ measured at the x-ray mask used for the results shown in FIG. 2. This reduction in fluorescence changes with dose accordingly, as the contrast drops to 10% for a 200 mJ/cm$^2$ exposure, and to 5% for 125 mJ/cm$^2$.

EXAMPLE 3

Experiments were performed to illustrate that the reduction in fluorescence intensity in the exposed regions of the chemically amplified photoresist was due to the interaction of the photogenerated acid molecules with the pH-dependent fluorophores. Two resist samples were formulated, one containing a photoacid generator (PAG) and one without. The PAG was 4,4'-isopropylidene bis(2,6-dibromophenol) (8 wt % against solids) in a novolak/hexamethoxymelamine resist. The PAG is described in G. Buhr et al., *Polym. Mater. Sci. Eng.* 61, 269 (1989), and is available from the Aldrich Corporation, Milwaukee, Wis. The samples with and without the PAG were processed identically and exposed at various doses. The sample without the photoacid generator showed no optical contrast even at doses as high as 600 mJ/cm$^2$. The sample with the photoacid generator showed images at all doses. Accordingly, it was concluded that the optical contrast is not due to the photobleaching of the fluorophores with exposure.

EXAMPLE 4

The spatial resolution of the optical system used in the present experiments was 400 nm using 514 nm illumination. However, this technique is scalable to near-field scanning optical microscopy (NSOM). See *Near Field Optics,* edited by M. A. Paesler and P. J. Moyer (Wiley, New York, 1996). With the enhanced resolution of this technique, measurement of photoacid diffusion in small lines is readily undertaken. NSOM is additionally useful for image modeling verification and studies of features as a function of mask/wafer gap and other parameters.

EXAMPLE 5

Another area in which the methods of the present invention are useful is in determination of the efficiency of photoacid generators. When evaluating the response of a PAG, it is necessary to know how many acid molecules are created as a function of dose. This is commonly accomplished by spectrophotometric titration. Unfortunately, to map out the response of the PAG as a function of dose may take days. Using the present technique, the time to compare the efficiency of one PAG as compared to another is be reduced to hours. In order to perform this fluorescence titration a dose matrix is printed on a single wafer, and the fluorescence at each field is measured. In each field, a 10×10 $\mu$m is scanned, and the fluorescence is averaged over all of the pixels, providing some statistical improvement over the data.

The results of this experiment for the chemically amplified photoresist composition SAL605® are shown in FIG. 3. This experiment measured the fluorescence from 0.5 $\mu$m films with approximately 00.07 wt % Cl-NERF added. As the exposure dose increases, more photogenerated acid molecules are created, and the fluorescence decreases. This experiment illustrates that this information may be used to quickly compare the efficiency of two different PAGs, or differing amounts of PAG.

In summary, a fluorescence-based technique for mapping pH gradients in chemically amplified photoresists has been disclosed herein. This invention is particularly advantageous in that it allows for the study of latent images formed in the resist, after exposure and without baking or developing the resist, for almost any lithographic technique used in the semiconductor industry today. In addition, this technique has the potential for the rapid determination of photogenerated acid yield among a variety of photoacid generators. Due to the low level of fluorophore required (0.01–0.1 wt %) and high signal to noise ratio, it can be used for photoacid yield determination in resists without altering the absorbance characteristics of the film. This is especially important in 193 nm lithography, or exposures using extreme ultraviolet lithography where the exposure depth is only about 200 nm.

In the drawings, examples, and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of measuring the amount of acid generated by a photoacid generator in a chemically amplified photoresist composition, comprising:
    exposing the chemically amplified photoresist composition to radiation, the photoresist composition comprising a photoacid generator and a pH-dependent fluorophore that fluoresces in the presence of an acid; and
    detecting the amount of the fluorescence generated by the chemically amplified photoresist, the amount of fluorescence correlating with the amount of acid generated by the photoacid generator, wherein the chemically amplified photoresist is applied to a substrate prior to the exposure to radiation, and a plurality of samples of the photoacid generators are applied to the substrate prior to exposing the chemically amplified photoresist to the radiation.

2. A method according to claim 1, wherein the plurality of samples comprises samples of different photoacid generators.

3. A method according to claim 1, wherein the plurality of samples is a dose matrix comprising different concentrations of the same photoacid generator.

4. A method according to claim 1, wherein the radiation is ultraviolet radiation.

5. A method according to claim 4, wherein the radiation is ultraviolet radiation of a wavelength of from about 180 nm to about 315 nm.

6. A method according to claim 1, wherein the substrate is an silicon wafer.

7. A method according to claim 1, wherein the weight percentage of the pH dependent fluorophore in the chemically amplified photoresist is from about 0.01 weight percent to about 0.1 weight percent.

8. A method according to claim 1 wherein the pKa of the pH-dependent fluorophore and the pH of the chemically amplified photoresist are within about 1.0 pH unit of each other.

9. A method according to claim 1, wherein the pH-dependent fluorophore is a derivative of rhodol.

10. A method according to claim 1, wherein the pH-dependent fluorophore is selected from the group consisting of 5-(and-6)-carboxy-2',7'-dimethyl-3'-hydroxy-6'-N-ethylamino-spiro[isobenzofuran-1(3H), 9'-xanthen-3-one and 5-(and-6)-carboxy-2'-chloro, 7'-dimethyl-3'-hydroxy-6'-N-ethylamino-spiro[isobenzofuran-1(3H), 9'-xanthen-3-one.

11. A method according to claim 1, wherein the chemically amplified photoresist comprises a novolak resin.

12. A method according to claim 1, wherein the chemically amplified photoresist is an electron beam/x-ray, negative tone chemically amplified photoresist.

13. A method according to claim 1, wherein the chemically amplified photoresist is baked prior to the exposure to the radiation.

14. A method according to claim 1, wherein the photoacid generator is 4,4'-isopropylidene bis(2,6-dibromophenol).

15. A method according to claim 1, wherein the detecting step is carried out by digital imaging fluorescence microscopy.

* * * * *